July 7, 1964 D. J. CARLSON 3,140,444

TUNER

Filed March 26, 1962 2 Sheets-Sheet 1

INVENTOR.
DAVID J. CARLSON
BY Eugene M. Whitacre
ATTORNEY

INVENTOR.
DAVID J. CARLSON
BY Eugene M. Whitacre
ATTORNEY

United States Patent Office 3,140,444
Patented July 7, 1964

3,140,444
TUNER

David John Carlson, Princeton, N.J., assignor to Radio Corporation of America, a corporation of Delaware
Filed Mar. 26, 1962, Ser. No. 182,461
12 Claims. (Cl. 325—445)

This invention relates to ultra high frequency tuners and more particularly to transistor oscillator circuits which are tunable over a wide range of ultra high frequencies.

At present, many television receivers include an ultra high frequency (UHF) tuner as well as a very high frequency (VHF) tuner. Advances in the transistor art have made it possible to transistorize the VHF tuner and the other signal translating stages in a television receiver. However, difficulties have been encountered in attempting to transistorize the local oscillator circuit in the UHF tuner because of limitations in the frequency range over which transistor oscillators are operable. Since most television receivers utilize an intermediate frequency of 40 megacycles and, in the usual case, the oscillator is tuned to a frequency higher than the signal frequency by an amount equal to this intermediate frequency, practical UHF local oscillators must be operable over a frequency range extending from approximately 510 mc. to 940 mc. in order to properly heterodyne a signal transmitted in the assigned UHF band of 470 mc. to 890 mc. Although the oscillator frequency range overlaps and is somewhat above the assigned UHF television band, the frequency ranges of the oscillator and signal selector circuits will both be referred to as the UHF television band. It has been found that commercially available transistors do not oscillate throughout a sufficiently extensive frequency range when operated in the known feedback configurations wherein the feedback oscillator uses one or more reactance devices to externally couple the output electrode lead to the input electrode lead. It would be desirable to transistorize the UHF tuner and thereby benefit from the advantages of transistors such as the elimination of the filament supply, low operating voltage, ruggedness, dependability, etc. Additionally, the vacuum tubes which are commonly utilized in present UHF tuners tend to have an early failure rate and also exhibit relatively high radiation losses, as compared to transistors.

Accordingly, it is an object of this invention to provide an improved transistor oscillator circuit which is tunable over a wide range of ultra high frequencies.

It is an other object of this invention to provide an improved feedback transistor oscillator which will oscillate over the entire frequency range of the UHF television band.

It is another object of this invention to provide an improved transistor local oscillator for UHF tuners which will oscillate over the entire frequency range of the UHF television band without the necessity of externally coupling reactance devices from the output electrode to the input electrode to provide a feedback path.

In present UHF tuners, a resonant transmission line, end-loaded by a variable capacitor, is normally utilized to tune the vacuum tube oscillator. The longer the physical length of the line, or the more capacitance exhibited by the variable capacitor, the lower will be the frequency at which oscillations are sustained. Transistors were found to oscillate at higher frequencies than vaccum tubes when directly substituted for a vacuum tube in an existing UHF television tuner and would not tune over a range of frequencies coextensive with the UHF television band. Increasing the physical length of the transmission line lowered the frequency range over which the transistor oscillator was tunable so as to be within the UHF television band but the range was not broad enough to cover the entire UHF television band. Increasing the size of the terminating tuning capacitor had a similar effect. Furthermore, such an increase in the length of the transmission line or in the size of the terminating capacitor resulted in excessively bulky tuners.

Attempts to increase the range of the transistor oscillator by adding a lumped capacitor to an appropriate location on the transmission line to lower the minimum frequency of oscillations, as is done in existing vacuum tube tuners, did not solve the problem. It was found that there was a definite value of capacitance which, when exceeded, would cause the transistor oscillator to operate at a fixed frequency and which could not be changed.

Accordingly, it is still another object of this invention to provide a transmission line the characteristics of which may be adjusted to select a desired frequency range over which an oscillator may be tuned.

It is still a further object of this invention to provide a transmission line the characteristics of which may be adjusted to expand or contract the operating range of an oscillator coupled thereto.

An ultra high frequency oscillator in accordance with the invention includes a transistor encapsulated in a conductive casing and having input, output and common electrodes. The transistor is mounted in a chassis compartment of conductive material in a manner such that the conductive casing of the transistor is spaced from the chassis to provide a substantial impedance between the casing and the chassis for signals in the UHF television band. The transistor is biased to act as the active element in the oscillator circuit, and the interelectrode reactances, from the output electrode to the input electrode, provides the regenerative feedback path to sustain oscillations when the conductive casing is isolated from the chassis compartment.

Tuning circuit means, such as a resonant transmission line, is coupled to the output electrode of the transistor to tune the oscillator. The transmission line includes a conductive member or transmission line conductor which is mounted in spaced relation to the chassis, which chassis comprises the ground plane for the transmission line. The transmission line is end-loaded by a variable capacitor to tune the oscillator over a range of frequencies, the low and high extremities of which respectively correspond to the maximum and minimum capacitance exhibited by the variable capacitor.

In accordance with a further aspect of the invention, the transmission line is provided with frequency range adjustment means to insure that the oscillator may be tuned over the entire range of frequencies in the UHF television band. The range adjustment means includes a conductive strip which is mounted to make electrical contact with the chassis. The conductive strip is positioned between the chassis and the transmission line conductor so as to extend lengthwise along a substantial portion of the line conductor, but spaced therefrom. Adjusting screws, supported by the chassis, are connected to the conductive strip to adjust the spacing between the conductive strip and the transmission line conductor and thereby vary the frequency characteristics of the transmission line. As will be explained in more detail subsequently, separate frequency range adjustment means are provided to adjust the high frequency characteristics of the transmission line and the low frequency characteristics thereof.

In one physical embodiment of the invention, the transmission line conductor is folded in a configuration to correspond to the contours of the walls of the chassis compartment, but spaced therefrom. Such a configuration concentrates the oscillatory energy generated by the oscillator. A conductive loop or coupler is inserted into the compartment and extends to a point within the fold of the transmission line to couple the oscillatory energy to the mixer stage of the tuner. Such a folding of the transmission line conductor causes the conductive coupler to efficiently couple oscillatory energy from the oscillator over the entire range of frequency to which the oscillator may be tuned.

The novel features that are considered to be characteristic of this invention are set forth with particularity in the appended claims. The invention itself, however, both as to its organization and method of operation, as well as additional objects and advantages thereof, will best be understood from the following description when read in conjunction with the accompanying drawing, in which:

Figures 1, 2, 3:
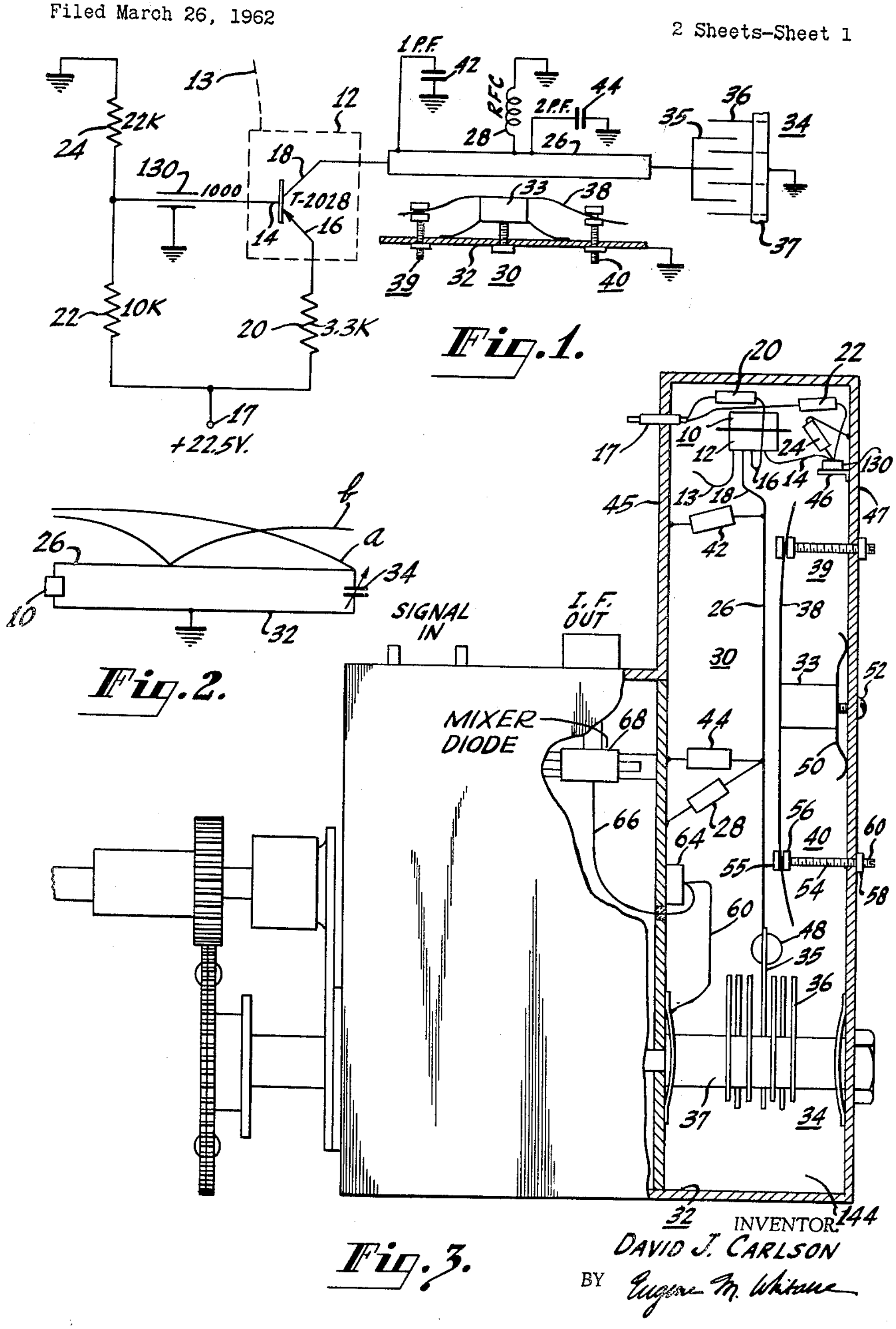
FIGURE 1 is a schematic circuit diagram of an ultra high frequency transistor oscillator in accordance with the invention.
FIGURE 2 is a diagrammatic illustration of the standing wave patterns along the transmission line at the extreme settings of the variable tuning capacitor terminating the line.
FIGURE 3 is a side elevational view of a UHF television tuner, partly broken away to show the oscillator compartment thereof, which includes a tunable local oscillator constructed in accordance with the invention.

Referring now to FIGURE 1, this oscillator embodying the invention comprises a transistor 10 which is encapsulated in a conductive casing 12 having a grounding lead 13, both shown dotted, and which includes base 14, emitter 16, and collector 18 electrodes. The transistor 10 is biased by coupling the emitter electrode 16 through a resistor 20 to a positive terminal 17 of a power supply, not shown, and the base electrode 14 to the junction of a pair of resistors 22 and 24, which are serially connected between the terminal 17 and ground. The basing path for the collector electrode 18 is completed to ground through a transmission line conductor 26 and a radio frequency choke coil 28 connected between a point on the conductor 26 and ground. The base electrode 14 is grounded for A.C. operation through a disc capacitor 130.

The tuning circuit means for the oscillator comprises a transmission line 30, which includes the conductor 26 and a ground plane 32, and a variable capacitor 34, which terminates the transmission line 30. The ground plane 32 may, for example, comprise the conductive chassis of a UHF tuner. The variable capacitor 34 includes a set of stator plates 35, connected to and supporting one end of the transmission line conductor 26, and a set of rotor plates 36 mounted on a rotatable shaft 37 and positioned to mesh with the stator plates 35 to vary the capacitance which terminates the transmission line 30.

Frequency range adjustment means for the oscillator includes a flexible conductive strip 38 which is mounted in conductive contact with the ground plane 32 by means of an adjustable support 33. The support 33, as will be explained in more detail subsequently, is made adjustable to select an initial desired characteristic impedance for the transmission line 30. The conductive strip 38 is positioned between the ground plane 32 and the transmission line conductor 26 and extends along an appreciable portion of the conductor 26 but is spaced therefrom. Adjustment means 39 and 40, which will be described in more detail subsequently, are provided to independently vary the spacing between portions of the conductive strip 38 and the transmission line conductor 26 to alter the frequency characteristics of the transmission line 30.

The oscillator is stabilized against frequency drift by coupling a pair of temperature sensitive capacitors 42 and 44 between appropriate points on the transmission line conductor 26 and ground.

In operation, the transistor 10 is biased to conduction by the biasing circuit means hereinabove described. It is to be noted that neither the conductive casing 12 nor the casing ground lead 13 are connected to ground. The conductive casing 12 by being mounted in spaced relation to the ground plane or chassis 32 provides a substantial impedance between the casing 12 and the chassis 32 at oscillatory signal frequencies. The reactances exhibited between the transistor 10 leads and electrodes and the ungrounded casing 12 provide a feedback path between the output collector electrode 18 and the input emitter electrode 16 to cause the transistor 10 to oscillate. While the exact theory of feedback has not been formulated for this oscillator, it is believed that the interelectrode capacitance exhibited between the transistor 10 electrodes, the distributed reactances exhibited between the various transistor electrode leads, and the distributed reactances between the transistor electrode leads and the walls of the conductive casing 12, provide a feedback path to sustain oscillations in the transistor 10. It has been noted that if the conductive casing 12, or the ground lead 13 therefor, is connected to the chassis ground, the range of oscillations of the transistor 10 is insufficient to cover the entire UHF television band. Similarly, in transistors made without a ground lead 13, the grounding of the conductive casing 12 produces a similar result. Additionally, attempts to provide an external feedback path, such as by coupling reactance devices between the output and input electrodes of the transistor 10, have also resulted in an oscillator with a range of oscillations insufficient to cover the entire UHF television band.

The oscillator circuit may be tuned over a range of frequencies by varying the capacitor 34. The oscillator is tuned to the lowest frequency of oscillation when the variable capacitor 34 exhibits a maximum capacitance. This occurs when the set of rotor plates 36 are completely meshed with the stator plates 35 in the capacitor 34. In this condition, the transmission line 30 functions substantially as a shorted-end, quarter-wave resonant line having a voltage standing wave pattern exhibiting a voltage null across the capacitor 34, as shown by the curve "*a*" in FIGURE 2. The oscillator is tuned to the highest frequency of oscillation when the rotor plates 36 are rotated to the extreme position away from the stator plates 35 and the variable capacitor 34 exhibits minimum capacitance. In this condition, the transmission line 30 functions substantially as an open-end half-wave resonant line having a voltage standing wave pattern exhibiting a voltage null intermediate the ends thereof, as shown by the curve "*b*" in FIGURE 2.

For commercial acceptance, the local oscillator in a UHF tuner should be tunable over a range of frequencies extending from at least 510 megacycles to approximately 940 megacycles. This frequency range is almost a ratio of 2:1 and can only be obtained if the capacitor 34 could be varied to exhibit a perfect short circuit at low frequencies and a perfect open circuit at high frequencies. Since this is impossible to obtain in practical capacitors, the variable capacitor 34 cannot tune over a 2 to 1 frequency range. However, the frequency range adjustment means 39 and 40 may be adjusted to independently extend the range of oscillations at both the low and high frequency limits respectively so that the oscillator may be tuned over this frequency range.

The initial spacing between the transmission line conductor 26 and the conductive strip 38, and therefore the characteristic impedance of the transmission line 30, is set to a desired value by means of the adjustable support 33. The flexible conductive strip 38 assumes a bow-like configuration due to the restraining influence exerted by the adjustment means 39 to 40. Varying the spacing between the conductor 26 and the conductive strip 38 at the capacitor 34 side of the line 30 by the adjustment means 40 adjusts the high frequency limit of the range over which the oscillator is tunable. Varying the spacing at the transistor 10 side of the line 30 by the adjustment means 39 adjusts the low frequency limit of the range over which the oscillator is tuntable.

Considering first the effects of the high frequency adjustment means 40, a decrease in the spacing between the conductive strip 38 and the transmission line conductor 26, contrary to what might be expected, increases the upper frequency limit to which the oscillator is tunable and has little effect on the low frequency limit thereof. Therefore the range of the oscillator is extended. Conversely increasing this spacing decreases the upper frequency limit and has little effect on the low frequency limit. Therefore the range of the oscillator is reduced.

It is believed that the change in the upper limit of the oscillator tuning range is due to a change of the characteristic impedance of the transmission line 30. When the oscillator is tuned to the upper frequency limit of oscillation, the plates of the capacitor 34 are fully open or unmeshed. However, a residual or minimum capacitance is still exhibited at the end of the transmission line 30 and prevents the line 30 from being fully open-circuited. To extend the upper frequency limit, the conductive strip 38 is moved closer to the transmission line conductor 26 by the adjustment means 40. The portion of the conductive strip 38 moved, although physically small, is a large fraction of the electrical length of the transmission 30 at high frequencies. The capacitance per unit length exhibited by the transmission line 30 is increased and the characteristic impedance of the line 30 is lowered. Lowering the characteristic impedance of the line 30 decreases the effect of the residual or minimum capacitance exhibited by the variable capacitor 34 and causes the oscillator to oscillate at higher frequencies, thereby raising the upper frequency limit of oscillations. Conversely, an increase in the spacing between the conductive strip 38 and the conductor 26 by the adjustment means 40 lowers the upper frequency limit of oscillation.

Adjustments of the adjustment means 40 has little effect on the low frequency operation of the oscillator, since the affected portion of the transmission line appears at a voltage null at low frequencies as shown in FIGURE 2.

The adjustment means 39 is operative to establish the low frequency limit of the range over which the oscillator is tunable while having little effect on the high frequency limit thereof. Since the transmission line 30 effectively appears as a quarter-wave line at low frequencies, the portion of the conductive strip 38 moved closer to the conductor 26 by the adjustment means 39 is only a small fraction of the electrical length of the line 30. Thus, it appears as if a lumped capacitor was added to the line 30. Since a voltage maximum appears across the transistor 10 end of the line 30 at low frequency operation, adding a lumped capacitor to the transistor 10 side of the line 30 is effective to decrease the low frequency limit of the range over which the oscillator is tunable. Conversely, moving the conductive strip 38 away from the conductor 26 subtracts capacitance from the line 30 and raises the low frequency limit of oscillations.

The change in capacitance caused by the adjustment means 39 has little effect on the high frequency limit to which the oscillator is tunable because, the portion of the conductive strip 38 which is moved thereby is located along a portion of the transmission line 30 where voltage nulls appear when the oscillator is tuned at the high frequency end of the tuning range. Furthermore an important aspect of the invention is that the capacitance added or subtracted by the adjustment means 39 appears across a substantial portion of the electrical length of the line and is thus effectively distributed, rather than lumped, at high frequencies. Thus, the added or subtracted capacitance does not present a finite lumped capacitive discontinuity in the line 30 at high frequencies.

Thus, the adjustment means 39 may be adjusted to control the low frequency limit of the range over which the oscillator is tunable while having little effect on the high frequency limit thereof. As a practical matter, it has been noted that adjusting the adjustment means 39 to move the conductive strip closer to the transmission line conductor 26 causes a slight reduction in the upper frequency limit of the tuning range.

Heretofore lumped capacitors have been added to UHF oscillators at substantially the high frequency null point of the resonant transmission line thereof. These fixed capacitors function similarly to the adjustment means 39 in low frequency operation to reduce the low frequency limit of oscillations obtainable from the oscillator circuit. However, at high frequencies, a lumped capacitor would have the effect of introducing a finite discontinuity in the line 30 and cause the oscillator circuit to operate at a frequency determined by the length of the transmission line 30 from the transistor 10 to the location of the lumped capacitor.

Thus, in accordance with the invention a transistor oscillator tuned by a resonant transmission line is provided with adjustment means which can adjust the frequency range over which the oscillator is tunable.

A physical exemplification of the local oscillator circuit shown schematically in FIGURE 1 is shown in FIGURE 3. Like reference numerals have been applied to corresponding parts as an aid in tracing the circuit in the physical embodiment. The tuner includes a double tuned selection circuit, not shown, for selecting any one of the 70 television channels in the UHF television band. The selected signal is heterodyned with a local oscillatory signal generated in accordance with the invention in the oscillator compartment 44 of the chassis 32. The oscillator includes the transistor 10 having the conductive casing 12 and grounding lead 13. The transistor 10 is mounted in the compartment 144 so that the casing 12 thereof is spaced from the chassis 32. Furthermore, the ground lead 13 for the casing 12 is not connected to the chassis ground 32. Mounting the transistor 10 is accomplished by connecting the emitter electrode 16 lead through the resistor 20 to the B+ terminal 17, which extends through, but is insulated from the chassis compartment side wall 45. The base electrode 14 lead is connected to the disc capacitor 130 which is mounted on a conductive strap 46 soldered to the other compartment side wall 47 of the chassis 32. The base electrode biasing resistor 22 is connected and supported between the terminal 17 and the capacitor 130, while the other base biasing resistor 24 is connected between the capacitor 130 and the side wall 47.

The transmission line conductor 26 is connected at one end to the collector electrode 18 lead of the transistor 10 and is connected and supported at the other end by the stator plates 35 of the variable capacitor 34. The stator plates 35 are supported on the chassis 32 by an insulating post 48. The stator plates 35 are adapted to mesh with the rotatable rotor plates 36 mounted on the tuning shaft 37. The tuning shaft 37 which is supported by the side walls of the chassis 32, extends from the oscillator compartment 144 through the signal selecting compartments to the exterior of the tuner to provide a means for simultaneously tuning the signal selection and oscillator circuits. The temperature compensating capacitors 42 and 44 and the radio frequency choke 28 are connected from the transmission line conductor 26 to side wall 45 of the chassis 32.

The frequency range extending means, including the flexible conductive strip 38 is mounted on the chassis 32 by suitably fastening it to the conductive support 33, such as by soldering thereto. The support 33 is mounted on a resilient adjustable member 50 and both are fastened to the wall 47 of the compartment 144 by screws 52. Such mounting permits the entire conductive strip 38 to be moved relative to the conductor 26 by means of the screws 52 to determine the initial characteristic impedance of the transmission line. The high frequency adjustment means 40 includes a screw 54, which is inserted through an aperture on the conductive strip 38, so that the strip 38 is positioned between the head 55 of the screw 54 and a lock nut 56. The screw 54 is supported by and extends through a threaded nut 58 fixedly mounted in an aperture on the wall 47. The end of the screw 54 includes a slot 60 accessible from the outside of the compartment wall 47 to permit adjustment of the spacing between the transmission line conductor 26 and the flexible conductive strip 38. The low frequency adjustment means 39 includes identical components as the adjustment means 40 and is similarly mounted.

A coupler or conductive strap 60 is mounted on the wall 45 of the compartment 144 by having one end connected to an insulating spacer 64 fastened to the wall 45 while the other end is directly connected to the wall 45. A conductor 66 is connected to the coupler 60 at the spacer 64 and extends to the next adjoining compartment through an aperture in the wall 45 to inject oscillatory energy into a diode mixer 68. The conductor 66 also performs the function of coupling signal energy to the diode 68.

The manner of mounting the transistor 10 entirely within the walls of the oscillator compartment 144 and the low energizing potential applied to a transistor results in lower oscillation radiation losses when compared to a vacuum tube oscillator, because the transistor oscillator operates at lower voltages than tube type oscillators, and because the transistor oscillator is completely enclosed in the conductively shielding tuner chassis.

Figure 4:
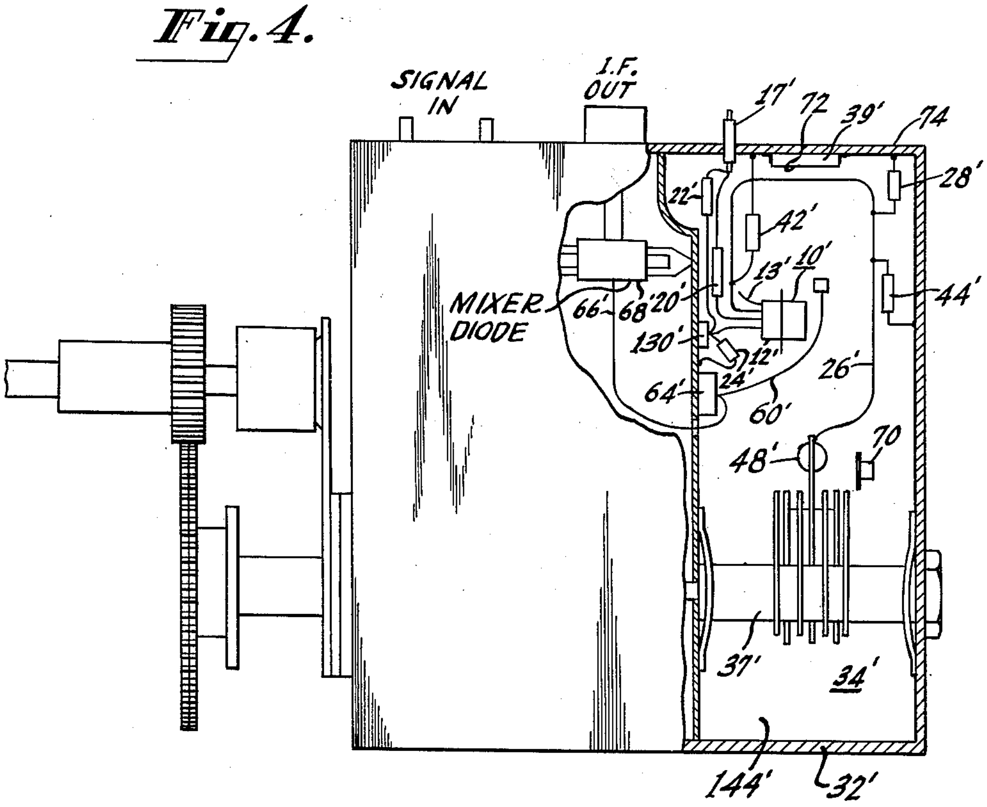
FIGURE 4 is a side elevational view of a UHF television tuner, partly broken away to show the oscillator compartment thereof, which includes another embodiment of a local oscillator constructed in accordance with the invention.

Referring now to FIGURE 4, a physical exemplification of another embodiment of the invention is illustrated. Similar, but not identical, reference numerals have been applied to components corresponding to those shown in the schematic circuit diagram of FIGURE 1 and the embodiment shown in FIGURE 3. The major differences between this embodiment of the invention and that shown in FIGURE 3 is in the configuration of the transmission line conductor 26′ and the replacement of the adjustment means 40 by a tab 70.

The transmission line conductor 26′ is folded around the walls of the oscillator compartment 144′ to concentrate the electromagnetic energy generated in the oscillator circuit. This folded configuration was found to provide better oscillatory energy injection into the diode mixer 68′ than results from a straight transmission line conductor such as 26 of FIGURE 3. A straight transmission line conductor such as 26 exhibits current and voltage maximum which move along the length of the conductor 26 in FIGURE 3 as the oscillator is tuned. Thus, at some frequencies there is better coupling to the coupler 60 in FIGURE 3 than at others. The coupler 60′ in FIGURE 4 by being inserted centrally within the folded configuration of the conductor 26′ is always in proximity to the current and voltage maxima exhibited as the transmission line is tuned. Thus, coupling problems are reduced and the coupling tends to be more uniform.

Another advantage in folding the transmission line conductor 26′ in FIGURE 4 is that the size of the oscillator compartment 144′ is substantially reduced as compared to the compartment 144 shown in FIGURE 3 which results in a reduced tuner size.

Figure 5:
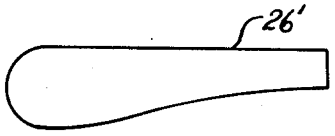
FIGURE 5 is an illustration of the transmission line conductor utilized in the embodiment of the invention shown in FIGURE 4 before the binding thereof.

The transmission line conductor 26′ is also tapered as shown in FIGURE 5. The effect of the taper is to increase the inductance exhibited by the conductor 26′ and thereby decrease the upper frequency limit of the range over which the oscillator circuit may be tuned. Furthermore, the conductor 26′ is spaced a greater distance from the chassis wall at the capacitor 34′ end of the line than at the transistor 10′ and to further decrease the upper frequency limit. As previously mentioned, a transistor oscillator normally oscillates at higher frequencies than a vacuum tube oscillator. Thus, one problem is reducing the range of oscillating frequencies without utilizing an excessively long transmission line conductor 26′ or large size capacitor 34′. Therefore, no adjustment means similar to the means 40 in FIGURE 3 is needed to extend the range of the oscillator circuit to higher frequencies. A tab 70 mounted on the chassis 32′ adjacent the variable capacitor 34′ is included in the embodiment of FIGURE 4. The tab 70 controls the high frequency limit of the oscillator tuning range. Increases in the capacitance between the transmission line 30 and the tab 70 by decreasing their spacing effectively lowers the highest frequency to which the oscillator circuit is tunable. Decreases in this capacitance have the opposite effect.

A low frequency adjustment 39′ is included in this embodiment of the invention and comprises a flexible conductive strip 72 folded in substantially a rectangular shape and soldered to the end wall 74 of the compartment 144′. The conductive strip 72 is positioned adjacent to but spaced from a portion of the transmission line conductor 26′. The position selected is in the region of the conductor 26′ where a voltage null appears in the high frequency end of the tuning range. An arrangement such as the means 40 shown in FIGURE 3 may be included to vary the spacing between the conductive strip 72 and the transmission line conductor 26′ or the spacing may be varied by utilizing a tool to move the strip 72. The remaining components in this embodiment of the invention are mounted somewhat similarly to the embodiment shown in FIGURE 3.

A continuously tunable transistor oscillator for a UHF tuner, which was built in accordance with the invention, utilized components having the values shown in FIGURE 1. The oscillator was tunable over a range extending from 493 to 1020 megacycles and exhibited good oscillator injection characteristics to the diode mixer in the tuner.

What is claimed is:

1. An oscillator tunable over a band of high frequencies comprising, in combination:
- a chassis of conductive material,
- an active oscillatory element comprising,
  - a transistor encapsulated in a conductive casing and mounted in said chassis so that said casing is physically spaced from said chassis to provide a predetermined reactive impedance between said chassis and said casing for oscillatory signals throughout said high frequency band, and
- tuning circuit means supported on said chassis and coupled to said transistor to tune said oscillator throughout said high frequency band.

2. In a high frequency tuner an ultra high frequency transmission line comprising, in combination:
- a conductive ground plane,
- a transmission line conductor spaced from said ground plane, and
- first and second means for adjusting the spacing between said transmission line conductor and said ground plane, to alter the characteristic impedance of said transmission line whereby said frequency characteristics of said transmission line are changed.

3. An oscillator tunable over a band of high frequencies comprising, in combination:
- a chassis of conductive material,
- an active oscillatory element comprising a transistor encapsulated in a conductive casing and having input, output and common electrode leads extending through said casing but insulated therefrom,
- means including said electrode leads for mounting said transistor is said chassis so that said casing is spaced from said chassis physically to provide a predetermined reactive impedance between said casing and said chassis for oscillatory signals throughout said high frequency band, and
- tuning circuit means including a tunable resonant transmission line supported on said chassis and coupled to tune said oscillator throughout said high frequency band.

4. An oscillator tunable over a band of high frequencies comprising, in combination:

a chassis member of conductive material, a transistor encapsulated in a conductive casing and having input, output and common electrodes, means for biasing said transistor to conduction to function as the active element in said oscillator, means including said biasing means for mounting said transistor on said chassis member so that said casing is spaced from said chassis member to provide a substantial impedance between said casing and said chassis member for oscillatory signals, said conductive casing providing a regenerative feedback path from said output electrode to said input electrode to sustain oscillations in said transistor throughout said high frequency band, and tuning circuit means supported on said chassis member and coupled to said transistor to tune said oscillator throughout the said high frequency band.

5. An ultra high frequency transmission line circuit comprising, in combination:

a conductive ground plane, a transmission line conductor spaced from said ground plane, an active oscillatory element coupled to one end of said transmission line, a variable capacitor coupled to the other end of said transmission line to tune said oscillatory element, a flexible conductive strip conductively mounted on said ground plane and disposed lengthwise along a substantial portion of said transmission line conductor but spaced therefrom, first adjustment means mounted near said one end of transmission line for varying the spacing between said conductive strip and said transmission line conductor at said one end, and second adjustment means mounted near the said other end of said transmission line for varying the spacing between said conductive strip and said transmission line conductor at the said other end of the transmission line.

6. An oscillator tunable over a band of high frequencies comprising, in combination:

a chassis of conductive material, an active oscillatory element comprising a transistor encapsulated in a conductive casing and having input, output, and common electrodes, means for mounting said transistor on said chassis so that said casing is spaced from said chassis to provide a regenerative feedback path from said output electrode to said input electrode to sustain oscillations in said transistor throughout said high frequency band, a conductive member having one end coupled to the output electrode of said transistor, a variable capacitor mounted on said chassis member and coupled to the other end of said conductive member, means including said variable capacitor for supporting said conductive member in spaced relation to said chassis member to provide in combination with said chassis member a transmission line which is tunable by said variable capacitor, and means for adjusting the spacing between said conductive member and said chassis member to adjust the frequency range over which said oscillator is tunable.

7. An oscillator tunable over a band of high frequencies comprising, in combination:

a chassis member of conductive material, a transistor encapsulated in a conductive casing and having input, output and common electrodes, means for biasing said transistor to conduction to function as the active element in said oscillator, means including said biasing means for mounting said transistor on said chassis member so that said casing is spaced from said chassis member to provide a substantial impedance between said casing and said chassis member for oscillatory signals, said casing providing a regenerative feedback path from said output electrode to said input electrode to sustain oscillations in said transistor throughout said high frequency band, a conductive member coupled to said transistor and mounted in spaced relation to said chassis member to provide in combination with said chassis member a transmission line for determining the frequency of said oscillatory signals, means including a variable capacitor coupled to said transmission to tune said oscillator throughout said high frequency band, and means for adjusting the spacing between said conductive member and said chassis to adjust the frequency range of said oscillator.

8. An oscillator tunable over a band of high frequencies comprising, in combination:

a chassis compartment enclosed by walls of conductive material, an active oscillatory element comprising a transistor encapsulated in a conductive casing and having input, output, and common electrodes, means for mounting said transistor on said chassis so that said casing is spaced from said chassis to provide a regenerative feedback path from said output electrode to said input electrode to sustain oscillations in said transistor throughout said high frequency band, a conductive member folded in the shape of a U and having one end coupled to the output electrode of said transistor, means including a variable capacitor coupled to the other end of said conductive member for supporting said conductive member in spaced relation to the walls of said chassis compartment to provide a tunable transmission line for tuning said oscillator throughout said high frequency band, and a conductive coupler mounted between but spaced from the ends of said U-shaped conductive member to couple oscillatory energy from said oscillator.

9. An oscillator tunable over a band of high frequencies comprising, in combination:

a transmission line including, a chassis of conductive material, and a conductor mounted in spaced relation to said chassis ground plane, a transistor encapsulated in a conductive casing and mounted at one end of said transmission line to comprise the active element thereof, said transistor mounted spaced from said chassis to provide a substantial impedance between said casing and said chassis for oscillatory signals throughout said high frequency band, a flexible conductive strip mounted on said chassis and disposed lengthwise along a portion of said conductor but spaced therefrom, said conductive strip being mounted in said chassis member to form in combination with said chassis member a ground plane for said transmission line, and means for adjusting the spacing between said conductive strip and said conductor to extend the frequency range over which said oscillator may be tuned.

10. An oscillator tunable over a band of high frequencies comprising, in combination:

a chassis member of conductive material, a transistor encapsulated in a conductive casing and having input, output and common electrodes, means for biasing said transistor to conduction to function as the active element in said oscillator, means including said biasing means for mounting said transistor on said chassis member so that said casing is spaced from said chassis member to provide a substantial impedance between said casing and said chassis member for oscillatory signals, said casing providing a regenerative feedback path from said output electrode to said input electrode to sustain oscillations in said transistor, a variable capacitor mounted on said chassis, a conductive member mounted between said variable capacitor and the output electrode of said transistor in spaced relation to said chassis member to provide in combination with said chassis member a transmission line for determining the frequency of said oscillations, a flexible conductive strip mounted on said chassis member to form in combination with said chassis member a ground plane for said transmission line, said conductive strip disposed lengthwise along a portion of said conductive line member but spaced therefrom, and means for adjusting the spacing between said conductive strip and said conductive member to extend the frequency range over which said oscillator may be tuned.

11. In an ultra high frequency tuner including a conductive chassis having a pair of compartments, a signal selecting circuit for selecting any one of a plurality of television signals mounted in one of said compartments, a diode mounted in said one compartment for mixing said received television signals with oscillatory signals generated in the other of said compartment, comprising in combination, a transistor encapsulated in a conductive casing and having input, output and common electrodes, means for biasing said transistor to conduction, means including said biasing means for mounting said transistor in said other compartment so that said casing is spaced from said conductive chassis to provide a substantial impedance between said casing and said chassis, said conductive casing providing a regenerative feedback path from said output electrode to said input electrode to sustain oscillations in said transistor throughout the UHF band, a U-shaped conductive member folded to correspond to the walls of said other compartment and having one end thereof connected to the output electrode of said transistor, means including a capacitor mounted on said chassis for supporting the other end of said conductive line member in spaced relation to said chassis to provide a frequency determining transmission line for said oscillator, means for varying the capacitance exhibited by said capacitor to tune said oscillator, said transmission line exhibiting a voltage null intermediate of the ends thereof when said capacitor exhibits a minimum capacitance, a conductive strip mounted on said conductive chassis and disposed to extend lengthwise along and spaced from a portion of said conductive member, said portion substantially coinciding with said voltage null exhibited by said transmission line, and means for adjusting the spacing between said conductive strip and said conductive line member to alter the frequency of oscillations when said capacitor exhibits a maximum capacitance.

12. An ultra high frequency oscillator tunable over a wide range of frequencies comprising in combination:

a chassis of conducting material providing an enclosure for said ultra high frequency oscillator;

tuning circuit means including a resonant transmission line supported within said enclosure;

adjustable means extending from within said chassis exteriorly thereof for changing the resonance frequency of said tuning circuit means;

a transistor device including at least three connection terminals corresponding to emitter, collector and base electrodes;

circuit means connecting said transistor device as the active element of said oscillator circuit;

said transistor being supported within said conductive enclosure solely by said connection terminals; and circuit means including a terminal coupled to said transistor for applying an operating potential to said oscillator, said operating potential terminal extending from within said conductive enclosure exteriorly thereof and being electrically insulated from said conductive enclosure.

References Cited in the file of this patent

UNITED STATES PATENTS

| | | |
|---|---|---|
| 2,479,537 | Fyler | Aug. 16, 1949 |
| 2,644,095 | Wilner | June 30, 1953 |
| 2,774,045 | Wilcox | Dec. 11, 1956 |
| 2,798,945 | Hinsdale | July 9, 1957 |
| 2,819,391 | Reiches | Jan. 7, 1958 |
| 2,913,683 | Mason | Nov. 17, 1959 |
| 2,966,618 | Lehner | Dec. 27, 1960 |
| 3,013,187 | Wyma et al. | Dec. 12, 1961 |

FOREIGN PATENTS

| | | |
|---|---|---|
| 1,198,918 | France | June 15, 1959 |
| 1,062,773 | Germany | Aug. 6, 1959 |
| 612,627 | Canada | Jan. 17, 1961 |